United States Patent
Janssen et al.

(10) Patent No.: US 8,817,229 B2
(45) Date of Patent: Aug. 26, 2014

(54) METHOD OF COOLING AN OPTICAL ELEMENT, LITHOGRAPHIC APPARATUS AND METHOD FOR MANUFACTURING A DEVICE

(75) Inventors: Franciscus Johannes Joseph Janssen, Geldrop (NL); Erik Roelof Loopstra, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 450 days.

(21) Appl. No.: 13/081,190

(22) Filed: Apr. 6, 2011

(65) Prior Publication Data
US 2011/0249245 A1    Oct. 13, 2011

Related U.S. Application Data

(60) Provisional application No. 61/321,646, filed on Apr. 7, 2010.

(51) Int. Cl.
| | |
|---|---|
| *G03B 27/52* | (2006.01) |
| *G02B 7/18* | (2006.01) |
| *G03F 7/20* | (2006.01) |
| *F28D 15/00* | (2006.01) |

(52) U.S. Cl.
CPC ........... *G03B 27/52* (2013.01); *G02B 7/181* (2013.01); *G03F 7/70825* (2013.01); *F28D 15/00* (2013.01); *G03F 7/70891* (2013.01); *G03F 7/709* (2013.01)
USPC .............................................. 355/30; 355/53

(58) Field of Classification Search
CPC . G03F 7/709; G03F 7/70825; G03F 7/70891; F28D 15/00; G02B 7/181

USPC ................................ 355/30, 53, 67; 359/845
See application file for complete search history.

(56) References Cited

U.S. PATENT DOCUMENTS

| | | | | |
|---|---|---|---|---|
| 7,315,347 | B2 * | 1/2008 | Miyajima | 355/30 |
| 8,339,569 | B2 * | 12/2012 | Schoeppach et al. | 355/30 |
| 2005/0105066 | A1 | 5/2005 | Franken | |
| 2009/0147386 | A1 * | 6/2009 | Sogard et al. | 359/845 |

FOREIGN PATENT DOCUMENTS

EP          1522892 A       4/2005

* cited by examiner

*Primary Examiner* — Peter B Kim
(74) *Attorney, Agent, or Firm* — Pillsbury Winthrop Shaw Pittman LLP

(57) ABSTRACT

A method of thermally conditioning an optical element operating in a vacuum environment. The optical element includes a first body having at least one optical surface and at least one heat transfer surface. The first body is dynamically controlled in position and/or orientation. The method includes controlling a temperature of a second body to a desired temperature, the second body including a second heat transfer surface; positioning the second body adjacent the first body and dynamically controlling the second body in position and/or orientation so as to maintain the first and second heat transfer surfaces in a substantially constant arrangement without contact between the bodies; and delivering a gas as a heat transfer medium into a heat transfer space defined by the first and second heat transfer surfaces, while controlling the pressure of the gas in the heat transfer space to between about 30 Pa and about 300 Pa.

21 Claims, 4 Drawing Sheets

METHOD OF COOLING AN OPTICAL ELEMENT, LITHOGRAPHIC APPARATUS AND METHOD FOR MANUFACTURING A DEVICE

CROSS-REFERENCE TO RELATED APPLICATIONS

This application claims the benefit of priority from U.S. Provisional Patent Application No. 61/321,646, filed Apr. 7, 2010, the content of which is incorporated herein by reference in its entirety.

FIELD

The present invention relates to optical elements and systems, particularly methods of cooling optical elements in a near-vacuum environment. The invention further relates to lithographic apparatus and a method for manufacturing a device. The invention finds particular application in extended ultraviolet (EUV) lithography apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$, is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

The properties of EUV radiation require substantial changes in the nature of the optical system. In general, refractive optical elements would absorb too much of the wanted radiation, and so the optical systems for EUV illumination and projection are designed using reflective optical elements (mirrors). Furthermore, a gaseous atmosphere would absorb the EUV radiation, and so the optical system is housed in a vacuum chamber and operated substantially in a vacuum. These changes present many challenges in the design of optical systems for EUV radiation.

A significant part of the EUV light is absorbed in the mirrors due to the relatively low reflection of the mirrors; this causes the mirrors to heat up, and to heat up non-uniformly. This heat-up leads to mirror deformation and reduced optical performance. (In a lithographic apparatus, performance measures would be imaging & overlay.) In the projection optical system, mirrors are made with the low expansion coefficient materials. Even so, without active thermal conditioning of the mirrors, the deformation is too high to reach acceptable optical performance. In the examples to be described, cooling will be used as an example of thermal conditioning. The more general term "thermal conditioning" is used to encompass not only simple cooling, but any process for imposing a desired temperature distribution throughout the optical element. This could be by cooling, by heating or by application of different degrees of heating and/or cooling at different points in space and/or time. Where the description refers for example to a "cooling fluid", "cooling plate" or "cooling body", this is to be understood as merely an example of a thermal conditioning fluid, body, etc.

Thermally conditioning the mirrors directly with air or water channels tends to cause dynamic vibrations leading to unacceptable performance loss, at least in the most critical elements.

SUMMARY

The invention aims to provide improved cooling arrangements for optical elements in a vacuum optical system such as in the projection system of EUV lithographic apparatus.

According to an aspect of the invention, there is provided a method of thermally conditioning an optical element operating in a vacuum environment. The optical element comprises a first body having at least one optical surface and at least one heat transfer surface, the first body being dynamically controlled in position and/or orientation. The method includes controlling a temperature of a second body to a desired temperature, the second body comprising a second heat transfer surface of a form complementary to that of the first heat transfer surface; positioning the second body adjacent the first body and dynamically controlling the second body in position and/or orientation so as to maintain the first and second heat transfer surfaces in a substantially constant arrangement without contact between the bodies; and delivering a gas as a heat transfer medium into a heat transfer space defined by the first and second heat transfer surfaces, while controlling the pressure of the gas in the heat transfer space to be at a predetermined value between about 30 Pa and about 300 Pa.

According to an aspect of the invention, there is provided an optical system for extreme ultraviolet radiation. The optical system includes a vacuum chamber configured to contain the optical system within a near-vacuum environment; an optical element comprising a first body mounted within the vacuum chamber, the first body having at least one optical surface and at least one first heat transfer surface; a plurality of actuators configured to support the first body, the actuators being operable to control the position and/or the orientation of the optical element with respect to a supporting structure; a thermal conditioning element comprising a second body having at least one second heat transfer surface; a gas deliverer configured to deliver a gas as a heat transfer medium into a heat transfer gap between the first and second heat transfer surfaces; and a support configured to support the second body in a substantially fixed relation to the first body so as to maintain the heat transfer gap below a predetermined value without permitting contact between the first and second bodies.

The invention further provides a lithographic apparatus incorporating the optical system including one or more such cooled optical elements.

The invention further provides a method of manufacturing a device, for example a semiconductor device, using the optical system set forth above as part of a lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
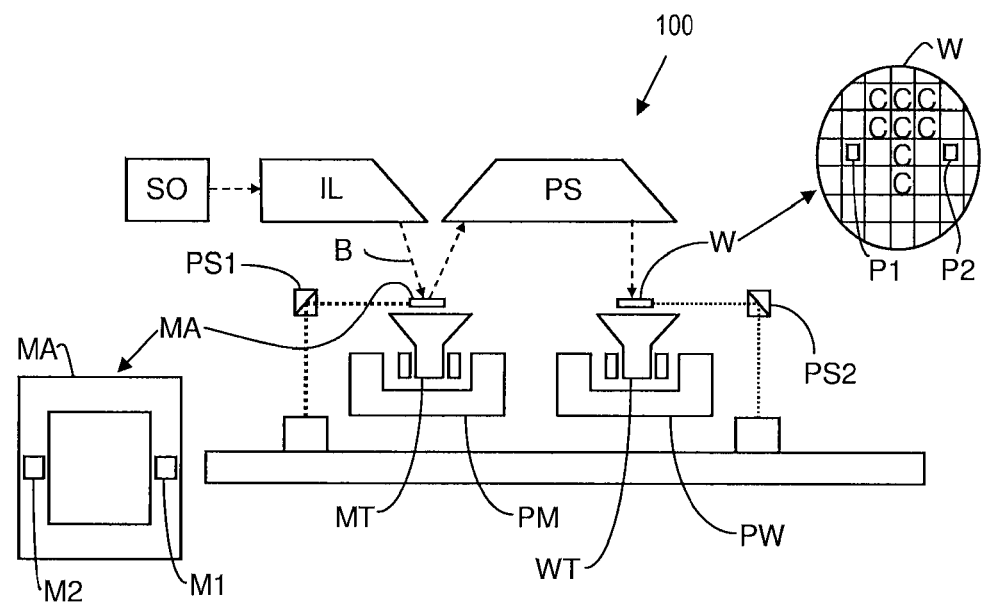
FIG. 1 depicts schematically a lithographic apparatus as an example of an optical system according to an embodiment of the invention.

FIG. 1 schematically depicts a lithographic apparatus 100 including a source collector module SO according to one embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
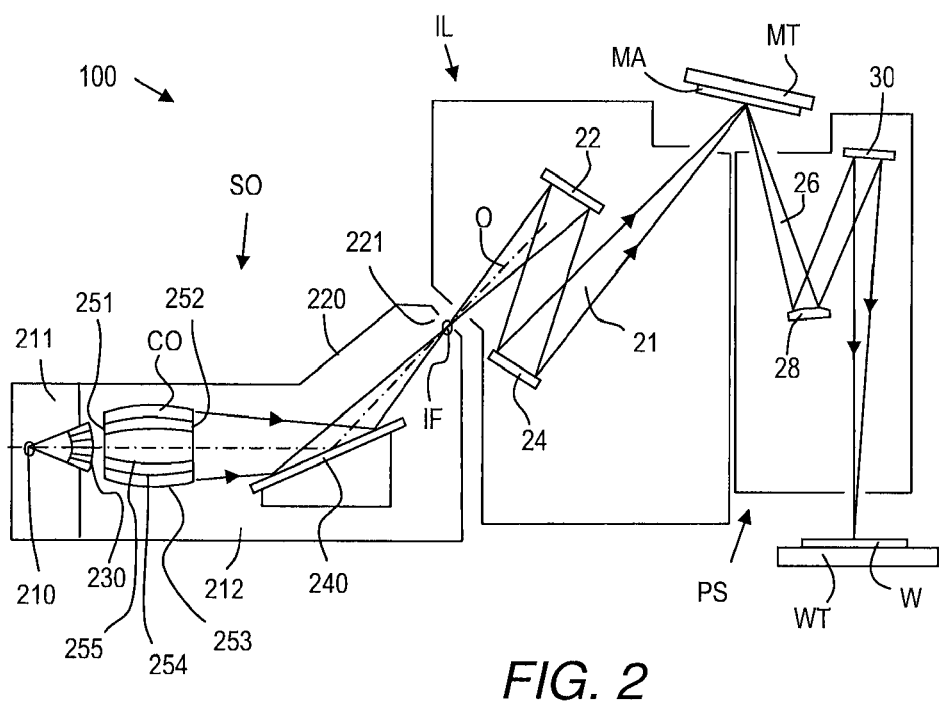
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contaminant trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Alternatively, the source collector module SO may be part of an LPP radiation system (not shown). In such an example, a laser is arranged to deposit laser energy into a fuel, such as xenon (Xe), tin (Sn) or lithium (Li), creating a highly ionized plasma with electron temperatures of several 10's of eV. The energetic radiation generated during de-excitation and recombination of these ions is emitted from the plasma, collected by a near normal incidence collector optic CO and focused onto the opening 221 in the enclosing structure 220.

In a further alternative arrangement (not shown), the spectral purity filter may be of a transmissive type, rather than a reflective grating. The radiation from source SO in this case follows a straight path from the collector to the intermediate focus IF (virtual source point). The spectral purity filter may be positioned at the virtual source point IF or at any point between the collector optic CO and the virtual source point. The filter can be placed at other locations in the radiation path, for example downstream of the virtual source point. Multiple filters can be deployed. As mentioned already, the collector CO may be of the grazing incidence type or of the direct reflector type.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components. In the context of the EUV optical system such as the lithographic apparatus illustrated, reflective components predominate.

The present application is concerned particularly with the challenge of keeping the optical elements of the projection system PS at a known, uniform temperature during operation. These optical elements shall be referred to for convenience as mirrors, without any limitation on the scope of protection. The mirrors of the EUV optical system can become warmed by the EUV radiation, which in practice is only partially reflected. In order to avoid overheating, and also to mitigate thermal stresses and distortions which would impair the optical performance, thermal conditioning (in this example cooling) is applied. In the source optics SO and illumination system IL, the mirrors can be directly cooled by water or other cooling medium, without impacting seriously the performance of the apparatus. In the projection system PS, however, direct cooling generally introduces vibrations, caused by the fluid flow itself and/or by coupling to a pump motor. These vibrations would disturb the imaging performance.

Prior published attempts to address the problem of cooling EUV projection optics have focused on (i) trying to reduce vibrations by careful design of the fluid coiling system and/or (ii) decoupling the mirror from a cooling system by various means. A heat transfer gap relying on radiation of heat across the vacuum has been proposed, but the inventors have found that the heat transfer achieved across a vacuum still allows undesirable heating. While it has also been considered to use a back-fill gas as a heat transfer medium between a mirror and a heat sink, the introduction of gas at appreciable pressures goes against the aims of the vacuum environment, and potentially introduces new sources of vibration and distortion, in place of the old ones. In particular, the mirror is generally supported on actuators giving real-time control of its position and attitude (orientation). If the heat sink is not coupled to the mirror, the gap for heat transfer gas will be quite variable and non-uniform across the mirror area. This in turn implies difficulty controlling the pressure to provide uniform cooling effect.

Figure 3A:
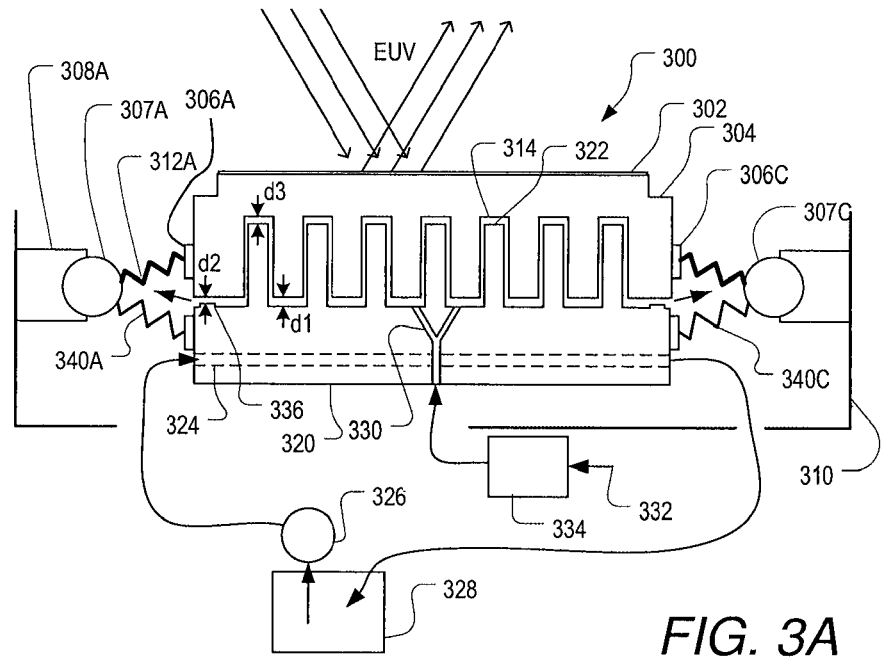
FIG. 3A is a cross-sectional schematic view of an optical element and associated cooling arrangement in an embodiment of a projection optical system of the apparatus of FIG. 2.
Figure 3B:
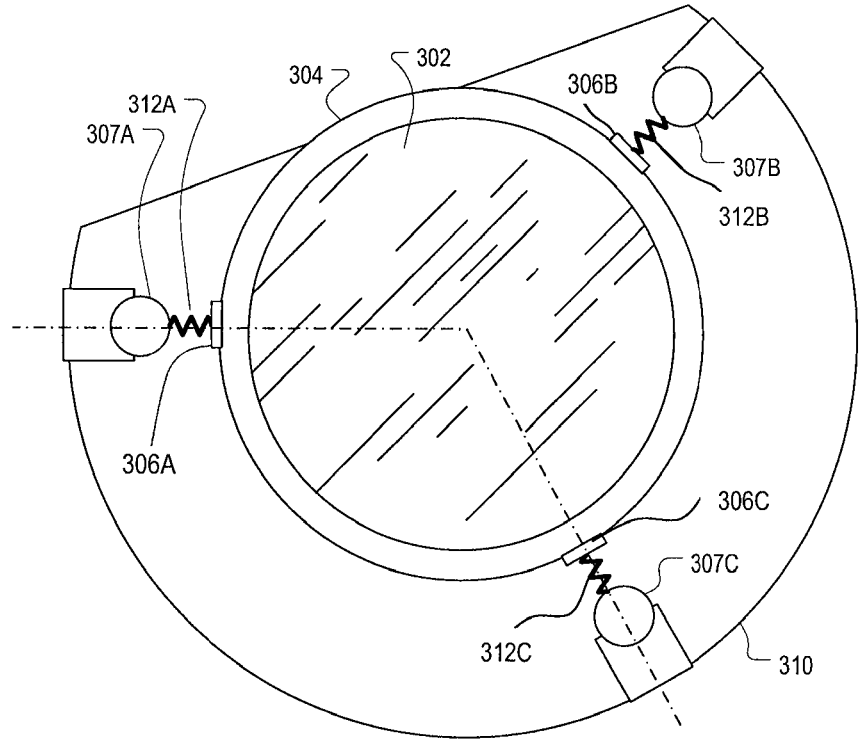
FIG. 3B is a plan view of the optical element of FIG. 3A.

FIGS. 3A and 3B show schematically a first embodiment of a mirror with cooling system, in radial cross-section and plan view, respectively. The cross-section in FIG. 3A follows the chain-dotted line in FIG. 3B. An EUV optical element in the form of a mirror 300 comprises a reflective surface 302 formed on a mirror body 304. Mirror body 304 is formed of a substrate material with a low coefficient of thermal expansion (CTE) in the operating temperature range. Special ultra-low expansion (ULE) glasses are commercially available for this purpose, and can be customized to minimize the CTE at a desired temperature value. For EUV radiation, reflective surface 302 is typically a multilayer metal-semiconductor structure, for example Mo—Si layers alternating in a stack.

Mirror body 304 is provided with mountings 306A-306C spaced angularly around the optical axis (not marked). Each mounting 306A-306C is coupled, via a respective actuator 307A-307C, to a respective support 308A-308C fixed on a frame 310. In this example, each actuator can drive the mirror mounting with two degrees of freedom. The three actuators together can therefore be controlled by an electronic system (not shown) to position and orient the mirror with six degrees of freedom. Other arrangements of actuators are possible. The actuators may be of piezoelectric type, for example, or electromagnetic (voice coil). In this example, each mounting 306A-306C is coupled to the actuator via a link 312A-312C which has the properties of a spring. Not shown in the diagram, but present as part of the mirror position and orientation control system, are sensors such as interferometers or optical encoders, measuring the position of different parts of the mirror in different axes. These actuators and sensors form part of a servo control system, well known to the skilled reader.

Away from the functional optical surface of the mirror 300 (surface 302) a heat transfer surface 314 is provided on the rear of mirror body 304. In this example, heat transfer surface 314 is recessed into the substrate material of body 304 so as to approach closely the functional (reflective) surface 302 where heat will be generated in operation. As shown, a number of recesses are formed, which are cylindrical bores and are distributed fairly uniformly across the substrate.

Adjacent the rear of mirror body 304 is a cooling device comprising a cooling body 320 which may be of metal having a good thermal conduction and low CTE. Aluminium may be suitable, for example. Cooling body 320 provided with a heat transfer surface 322 which faces heat transfer surface 314 of the mirror body 304. In particular, cooling body surface 322 is brought close to mirror body surface 314 by being located on a finger of material designed to project into the recess of the mirror body. Cooling body is provided with a number of fingers designed to project into the respective recesses and to receive heat from all the heat transfer surfaces 314 of the mirror body 304.

The number and form of the recesses is designed in each case to provide the required degree of cooling without undermining the structural integrity and stability of the mirror body. In an example where the mirror is several centimeters in diameter (e.g. 8-10 cm) and a few centimeters thick, the recesses may have a diameter on the order of one centimeter (say 0.5-1.5 cm) and a spacing between recesses on the order of 1-5 centimeters. The recesses need not be uniformly distributed, nor of uniform size and shape. Where the mirror surface 302 is curved rather than planar, the depths of the recesses may be tailored to the height of the mirror surface at each location. These considerations and other aspects of detailed design are discussed in U.S. Patent Application Publication No. 2005/0105066A (Franken/ASML).

While the heat transfer surfaces 314, 322 have been described as lying at the ends of the recesses & fingers, respectively, it will be appreciated that heat transfer will occur to some extent between the entire surfaces where one body faces the other. This includes the side walls of the recesses/fingers, and the back surface between the recesses/fingers. The degree of heat transfer across any part of the gap will depend greatly on the temperature difference between the two bodies at that point. By removing the heat as close as possible to its source, gradients of temperature in other parts of the body will be minimal in practice.

The cooling body 320 is maintained at a desired temperature by a circulation of fluid through conduits 324 in the body. A pump 326 provides steady flow of fluid, for example water, from a reservoir 328, where its temperature is monitored and controlled. Heat transferred to body 320 from body 304 is removed via this fluid; any temperature gradients through body 320 will tend to be evened out as well. The conduits may define one continuous path or several paths, as desired. Typically, the aim is to avoid temperature gradients in the optical system and its components, to maximize dimensional stability. Therefore the temperature of the cooling fluid in reservoir 328 is substantially equal to the desired operating temperature of the mirror and its immediate environment. In one example this temperature is 22 Celsius.

While the pump operation and the fluid dynamics in conduits 324 generate vibrations (noise) within body 320, this vibration is not transferred to the mirror body 304, by virtue of the gap that exists between the bodies. At the same time, the gap inevitably impedes heat transfer between the bodies.

The atmosphere within the optical system is not an absolute vacuum, but the pressure is very low, for example 1 to 5 Pa, say 3 Pa in the embodiment described. For heat transfer purposes, this is effectively a vacuum, and the transfer of heat across the gap between surfaces 314 and 322 would be limited to radiation only, and a rate of heat transfer of only 2 or 3 $Wm^{-2}$ can be achieved, per degree of temperature difference.

In order to provide heat transfer rates of an order of magnitude or more greater than radiation alone can provide, a gaseous heat transfer medium is introduced to the gap between the surfaces of 314 and 322 of the bodies 304 and 320 via a gas delivery conduit or conduits 330. The gas, which may for example be hydrogen ($H_2$) or helium (He), is supplied from a source 332 at atmospheric pressure via a regulator in the form of a mass flow controller 334. Since the bodies 304, 320 are nowhere in contact with one another, the injected gas escapes continuously around the periphery of the bodies.

Although the path for gas from conduits 330 to the periphery appears rather convoluted, in the two-dimensional cross-sectional view of FIG. 3A, it should be remembered that, in the third dimension, gas can flow around the fingers without entering the recesses. While the gas distribution space between the bodies 304, 320 has a width d1 across its area, a peripheral gap where the gas escapes from the space between the bodies has a width d2 which is significantly less than the gas distribution gap d1. This restricted gap can be formed, as illustrated, by a peripheral rim 336 on the surface of body 320, but it can also be formed by a rim on the mirror body 304, or a combination of features on one or both parts. The gap between the heat transfer surfaces of 314 and 322 (which for convenience will be referred to as the heat transfer gap) has a width d3, which may be the same as d1 or different.

If the peripheral gap were zero, then the bodies would be in contact and isolation of the mirror from vibrations in the cooling system would not be achieved. If the peripheral gap were not restricted at all, then the pressure of the heat transfer gas would diminish constantly along the path from the gas delivery conduits 330 to the periphery and the rate of heat transfer would not be uniform across the mirror. Also, the required flow to keep the pressure high enough would be such that the pressure in the whole vacuum chamber would be higher, increasing the unwanted absorption of EUV. Because d2 is smaller than d1, the flow rate of gas required to establish a desired pressure level within the heat transfer gap is reduced, and the gas pressure across the mirror the heat transfer gap is substantially equalized. Another consequence of uneven or excessive gas pressure could be distortion of the mirror body 304 and mirror surface 302, compounding the problem of thermal distortion. Variations in pressure over time are also to be avoided, as discussed further below.

In order to be able to equalize the pressure in the heat transfer gap without an excessive volume of gas leaking into the vacuum chamber, it is desirable to control the gap d2 to be as small as practicable. The gap should also be constant while the mirror moves under control of the actuators 307A-307C, to avoid variations in pressure over time. It is proposed that the gap d2 should be less than 1 mm, for example 0.5 mm or another value in the range 0.3-0.6 mm. To keep that gap constant requires that cooling body 320 should move in parallel with the mirror body 304. In the example of FIGS. 3A & 3B, this is achieved by supporting the cooling body 320 on the same actuators 307A-307C as the mirror body 304. In order to avoid coupling cooling system vibrations into the mirror body, cooling body 320 is supported on the actuators by linkages 340A-340C, which also have the properties of springs.

The spring constant (stiffness) of the spring 312A, together with the mass of the mirror body 304, determines the frequency response of the body 304 in following the actuator movements in position and orientation control. The spring constant may be different along different axes, or it may be uniform. Similarly the spring constant of the spring 340A, together with the mass of the cooling body 320, determines the frequency response of the body 320 in following the actuator movements in position and orientation control. Being mounted on the same actuator, independent sensors for the position of the cooling body are not needed, but may optionally be provided. An active adjustment mechanism (not shown) may be provided to set the gap d2. In one embodiment, the gap is set as part of a commissioning process, for example by set screws acting on some or all the spring linkages 312A-312C, 340A-340C where they meet the actuator and/or their respected supported body.

Figure 4:
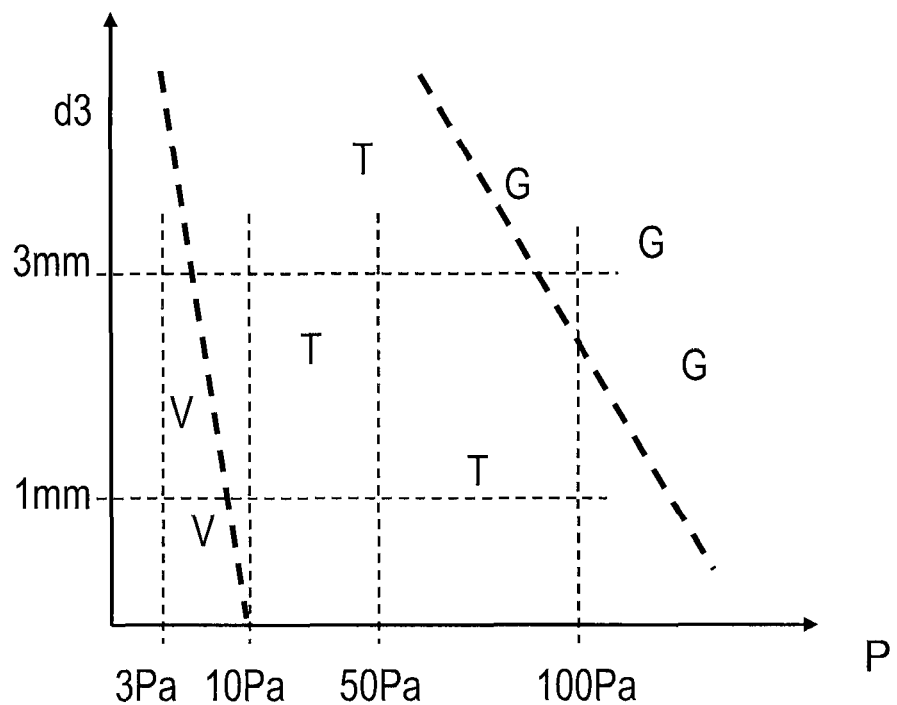
FIG. 4 is a graph schematically indicating dimensions and pressure ranges usable in the cooling arrangement of FIGS. 3A and 3B.

In operation, cooling the mirror body 304 is achieved by holding a cool surface 322 close by the mirror body, actuating it with the mirror to achieve constant, small separation, and increasing the gas pressure between the cool plate and the mirror. FIG. 4 illustrates, in a purely schematic and qualitative way, the influence of the gap size and the gas pressure on the heat transfer mechanisms. The size d1 of the heat transfer gap is indicated up the vertical axis. The pressure of gas in the heat transfer gap is indicated along the horizontal axis (non-linear scale). The heat transfer gas should be relatively inert for the purposes of the optical system (projection system PS in FIGS. 1-2). Hydrogen and Helium are examples to be considered. Hydrogen is abundantly available, and is already present in a typical EUV apparatus, for example in contaminant control. Provided the additional gas introduced for cooling the mirror or other element is not so great as to over-load the vacuum pumping system, Hydrogen will be a good candidate. The pressure of such gas in the near-vacuum environment of the EUV optical system will typically be less than 5 Pa, for example 3 Pa. With such a low pressure in the heat transfer space between surfaces 314 and 322, the apparatus would be operating substantially as a vacuum, indicated by the region 'V' in the graph of FIG. 4. In this region, only a poor cooling effect can be achieved, for example in the range 2-3 $Wm^{-2}K^{-1}$. Heat transfer in this region is by a mixture of radiation and (very poor) conduction. At pressures above 10 Pa, and especially above 50 Pa, conduction of heat by the gas molecules begin to provide significant conduction, and the cooling effect goes up. Above 100 Pa, the atmosphere in the gap would be fully gaseous (region 'G'). Heat transfer properties would be very good, but conduction would be dependent on the gap as well as the temperature difference. The gas would need to be contained to prevent overloading the vacuum system. Also, containing such a pressure behind the mirror body 304 could lead to distortion and/or vibration of the mirror which is undesirable.

At pressures between 10 Pa and 200 Pa, and particularly between 50 Pa and 100 Pa, the gas molecules can have a mean free path on the same order as the gap d3, so that the gas does not behave as a full gas, but rather has a transitional behavior, indicated by region 'T'. Nevertheless, in this region heat transfer is increased by an order of magnitude compared with radiation alone (>20 $Wm^{-2}K^{-1}$). The boundaries between these regions are not distinct as shown, and in reality there is a continuum of behavior as pressure increases. The behavior depends also on the choice of gas.

By careful design and selection in accordance with the principles disclosed herein, a pressure of gas providing greatly enhanced heat transfer can be achieved with a small amount of flow, thereby avoiding too high pressure in the vacuum chamber. The gap size d1 can be controlled to be small, for example 1-5 mm, especially 0.9-3.2 mm, to reduce the volume of gas required to achieve the desired pressure. To this end, the distance d2 between the bodies at the periphery of the gap is made small, for example in the range 0.1 mm to 1 mm or 0.3 mm-0.6 mm. for example 0.5 mm. Given the range of movements permitted of the mirror body 304 in its operations, such gaps are achieved and maintained constant only by moving the cooling body with the mirror by the actuation arrangement as shown in FIG. 3B (an alternative arrangement for the same purpose is discussed further below).

So long as the mass flow controller 334 delivers a steady rate of mass flow of heat transfer gas into the gap, and so long as the gaps d1, d2 and d3 remain constant, a desired pressure can be achieved and held constant. Sudden changes in pressure are to be avoided, as they could translate into vibrations of the optical surface 302. Moreover, since the pressure behind the body 304 will generally cause some distortion and the shape of the optical surface 302 is to be defined with extreme precision, the pressure difference between the back and front of mirror body 304 must be set at a specific value, such that the optical surface 302 is distorted by the pressure to exactly the desired shape. The accuracy required in setting this pressure depends on the stiffness of the mirror body 304. In some embodiments, the pressure varies by less than 5 Pa, desirably less than 1 Pa and particularly less than 0.5 Pa, during operation of the optical system. The mirror will be designed to achieve optimum performance at a certain pressure. In practice, the pressure, or rather the mass flow, will be adjusted during set-up to achieve optimum optical performance. The adjusted value of mass flow, and the gap properties between the bodies, should then remain constant to maintain the same pressure with high stability over the operating life of the apparatus.

The increased pressure is needed to have sufficient heat transfer to cool the mirror effectively. For example, with a heat transfer gap d3 of 1 mm, heat transfer in the range of 50 $Wm^2K^{-1}$ (50 Pa) to 90 $Wm^2K^{-1}$ (100 Pa) can be achieved. Increasing the gap d3 to, say, 3 mm will reduce the heat transfer to say 30 $Wm^2K^{-1}$ (50 Pa) to 50 $Wm^2K^{-1}$ (100 Pa). This seems disadvantageous, but may be desirable to relax other design constraints. For example, where d3 and d1 are equal, increasing d3 a little may serve to improve uniformity of the heat transfer across the whole area of the mirror body. For uniform heat transfer, the pressure throughout the heat transfer gap should be uniform. This will be achieved when the gas distribution gap d1 is substantially greater than the peripheral gap d2. Although the periphery referred to in these examples is the periphery of the bodies 304, 320 as a whole, it is also possible to provide distinct regions of heat transfer gas flow and heat transfer gas removal, separated from one another by respective 'peripheries'.

The degree of uniformity of gas pressure required is a matter of design choice, but examples here are designed so that, in the heat transfer gap d3, the minimum pressure of gas (near the peripheral rim 336) is at least 80% of the maximum pressure (near where the gas enters through conduits 330). A ratio d1/d2 may be greater than 2, for example, or greater than 3.

Figure 5:
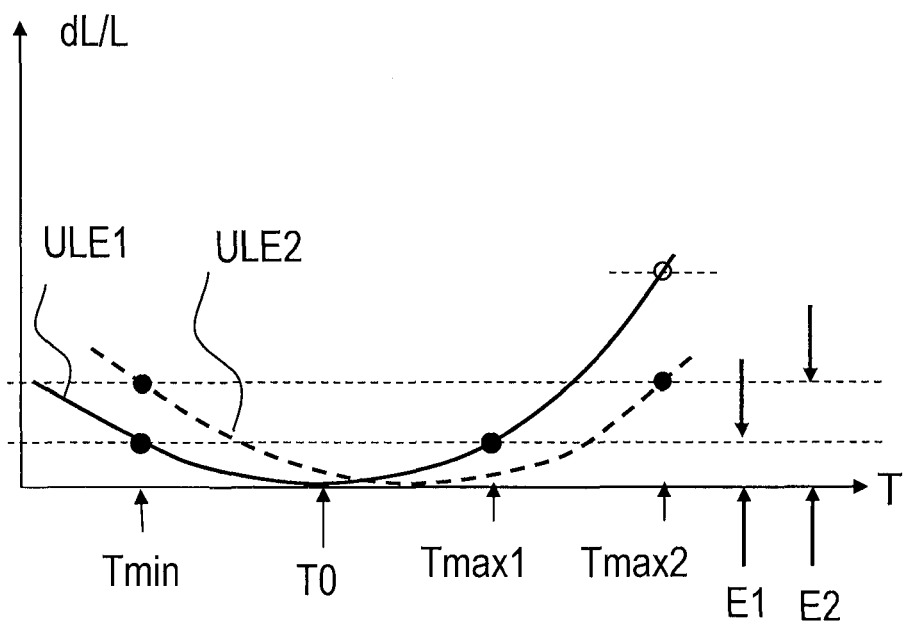
FIG. 5 is a graph schematically indicating certain design and performance characteristics in the apparatus of FIGS. 1 to 4.

FIG. 5 illustrates how a large gain in optical performance can be attained by control of mirror temperature using the invention. The mirror body 304 is made of a ultra-low thermal expansion (ULE) material with a thermal expansion related to temperature T by the curve ULE1 in FIG. 5. This figure shows the deformation (dL/L) on a representative scale, as a function of temperature. At a temperature T0, which can be freely selected when selecting the material, the deformation is virtually zero. Either side of this temperature T0, the coefficient of thermal expansion (CTE) is low, but increases to positive or negative values respectively, as the temperature rises or falls. Therefore, only by restricting the range of temperatures within the body can the ULE characteristics be fully exploited.

In a first example, the temperatures in the body range from a minimum temperature Tmin to a maximum Tmax1. In this example, Tmin will be the environment temperature of the optical system, for example 22 Celsius. Tmax1 will be the highest temperature reached by a part of the mirror body where the heating effect of incident radiation is strongest, and/or cooling is least effective. If the range of temperatures within the body can be confined to this range Tmin-Tmax1, the expansion throughout the body is limited to E1 at maximum, and the potential for distortion is accordingly very limited. If, on the other hand, heating and cooling performance permit part of the body to reach a higher temperature Tmax2, that part will lie on a steeper part of the curve ULE1, and the thermal expansion can reach a much greater value indicated by the open circle on the upper end of curve ULE1. By selecting material with a higher TO (curve ULE2), it may be possible to constrain the expansion to a more moderate level, E2, but still the thermal distortion in the mirror will be much greater than in the case with Tmax1.

Putting this theory into practice, in an example where the recesses and fingers reach up to 10-20 mm from the optical surface 302, and a heat transfer gas is introduced at a pressure of 100 Pa, the temperature gradient in mirror body 304 can be reduced by a factor of 2 or so. For example, where Tmin and Tmax2 might be 25 Celsius and 33 Celsius respectively without the fingers and the heat-transfer gas (range 8-9 degrees), Tmin and Tmax1 might be only 22 Celsius and 27 Celsius with the fingers and heat transfer gas (range 4-5 degrees). Furthermore, only the top part of mirror body 304 heats up significantly instead of the complete mirror. Because the thermal expansion of the ultra low expansion mirror material is very non linear with temperature, the deformation of the mirror (and consequently the optical aberrations) are reduced by a factor of 10, and the bottom part of the mirror hardly heats up. Selection of the material becomes simpler for all phases of operation, variations between operational and start-up states are also reduced.

Variations and additional design considerations will now be discussed. As mentioned above, the cooling body 320 may be subject to vibrations due to vibrations in the water circulation system. Measures to avoid transferring such vibrations to the mirror substrate are reducing the coolant flow rate and by mechanically damping cool plate vibrations. A spring constant of the linkage 340A-340C connecting the mirror to the actuator can be made larger than the spring constant of the connector connecting the cool plate to the actuator, so that coolant induced vibrations have little effect on the actuator or the mirror substrate.

For example, an eigenfrequency of the linkages 312A-312C connecting the mirror to the actuator shall may be over 200 Hz, for example 700-900 Hz, or 800 Hz, while an eigenfrequency of the connection between the cooling body 320 and the actuator may be less than 100 Hz, for example 20-23 Hz.

Figure 6:
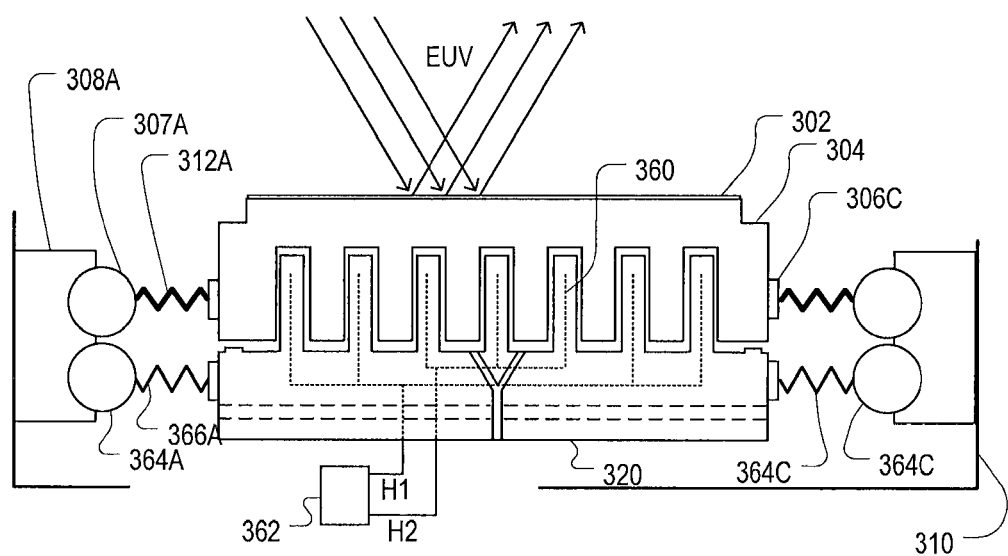
FIG. 6 is a cross-sectional schematic view of an optical element and associated cooling arrangement in an embodiment of the invention.

FIG. 6 illustrates two variations in the design of the cooling apparatus, which can be used individually or together to modify embodiments of the apparatus such as are shown in FIGS. 3A, 3B. Like reference signs are used for similar components. The water and gas circulation systems are omitted for clarity, though still provided as in the previous example.

In a first modification, heating resistance wires 360 are provided on the surface of cooling fingers or within the cooling fingers to change the heat transfer by activating this heating for a sub-group of fingers. Such a local heat transfer adjustment is desirable in the case the heat input to the mirror not uniform, and therefore non-uniform cooling would be appropriate. The heat input depends on the EUV radiation and may not eb uniform. For example, the illumination system may be designed so that the radiation is concentrated in two or more off axis sections of the substrate (in case of dipole illumination, for example). One would then compensate such asymmetric heat input with an equally asymmetric heat transfer, controlled by raising the temperature of some fingers and not others. A controller 362 has outputs H1, H2 which are connected to different groups of the wires, as illustrated. Similar effects could be achieved by segmented or non-uniform delivery of cooling fluid into the cooling body, or segmented or non-uniform delivery of the heat transfer gas.

The geometry of the cooling body and particularly the recesses and fingers may also be tailored in various ways, including the ways mentioned by Franken et al in U.S. Patent Application Publication No. 2005/0105066 (EP 1522892A corresponds). The techniques there are designed to make heat transfer more uniform; of course the geometry can be made to provide non-uniform heat transfer if required. As mentioned in the introduction, the cooling apparatus and methods described are examples of thermal conditioning apparatus and methods also encompassed by the invention. The thermal conditioning can be adapted readily to applications where elevated temperatures, heating, and uniformity of heating are desired.

Another modification shown in FIG. 6 is in the mounting of the cooling body 320 on actuators 364A-364C which are separate from the actuators 307A-307C carrying the mirror body 304 (optical element). Spring linkages 366A-366C are provided to connect the cooling body 320 to its actuators. The actuators 364A-364C are actively controlled, still with the aim of following mirror body 304 and keeping the heat transfer gap constant and keeping gas pressure constant in the heat transfer space. Each body's actuators may have their own servo controllers, or they may be driven by a common controller. Provided they are identical within a desired tolerance, the two bodies should move in parallel. It is likely that this variation makes the mounting less compact than the one in which the actuators are shared between the bodies 304 and 320, and potentially more expensive. However, benefit may be achieved in performance and cost overall, by improving the decoupling of the two bodies for vibration management, and by providing additional freedom for the designer in terms of frequency response of each actuator/spring/body combination.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A method of thermally conditioning an optical element operating in a vacuum environment, wherein said optical element comprises a first body having at least one optical surface and at least one heat transfer surface, the method comprising:

controlling a temperature of a second body to a desired temperature, the second body comprising a second heat transfer surface of a form complementary to that of the first heat transfer surface;

dynamically controlling the first body in position and/or orientation with a first actuator coupled to the first body via a first linkage;

positioning the second body adjacent the first body and dynamically controlling the second body in position and/or orientation with a second actuator coupled to the second body via a second linkage so as to maintain the first and second heat transfer surfaces in a substantially constant arrangement without contact between the bodies; and delivering a gas as a heat transfer medium into a heat transfer space defined by the first and second heat transfer surfaces, while controlling the pressure of the gas in the heat transfer space to be at a predetermined value between about 30 Pa and about 300 Pa.

2. A method as claimed in claim 1, wherein the predetermined value is between about 40 Pa and about 110 Pa.

3. A method as claimed in claim 2, wherein the predetermined value is between about 50 Pa and about 100 Pa.

4. A method as claimed in claim 1, wherein the gas is delivered to a gas distribution space comprising a gap between the first and second bodies, wherein the distribution space is in fluid communication with the heat transfer space, and is bounded by a relatively smaller gap in a peripheral region so that the delivered gas can escape while maintaining a degree of homogeneity over the distribution space.

5. A method as claimed in claim 4, wherein the gas distribution space has a smallest dimension greater than twice the dimension of the gap in the peripheral region.

6. A method as claimed in claim 5, wherein the smallest dimension of the gas distribution space is in the range of about 0.9 mm to about 5 mm, and wherein the dimension of the gap in the peripheral region is in the range of about 0.2 mm to about 0.8 mm.

7. A method as claimed in claim 1, wherein the delivery of gas is by a mass flow controller, the gas pressure between the first and second bodies varying over time, by less than about 5 Pa.

8. A method as claimed in claim 7, wherein the gas pressure between the first and second bodies varies over time, by less than about 1 Pa.

9. A method as claimed in claim 1, wherein a heat transfer gap between the first and second heat transfer surfaces is maintained at a value in the range of about 0.5 mm to about 5 mm.

10. A method as claimed in claim 1, wherein cooling fluid is circulated through the second body to control the temperature of the second body.

11. A method as claimed in claim 1, wherein for the dynamic control, the first body is coupled to a plurality of actuators via a plurality of first linkages and the second body is connected to the same actuators via a plurality of second linkages, the first linkages and the second linkages comprising spring elements configured to reduce transmission of vibrations from the second body to the first body.

12. A method as claimed in claim 11, wherein the coupling of the first body via the first linkages has an eigenfrequency substantially higher than the coupling of the second body via the second linkages.

13. A method as claimed in claim 12, wherein the eigenfrequency of the coupling of the first body is ten or more times the eigenfrequency of the coupling of the second body.

14. A method as claimed in claim 12, wherein the eigenfrequency of the coupling of the first body is more than about 200 Hz, and wherein the eigenfrequency of the coupling of the second body is less than 50 Hz.

15. A method as claimed in claim 1, wherein the first heat transfer surface includes a recessed portion in the first body, the recessed portion lying closer to the optical surface than surrounding portions, and wherein the second heat transfer surface is on a complementary projecting portion on the second body.

16. An optical system for extreme ultraviolet radiation, the optical system comprising:
a vacuum chamber configured to contain the optical system within a near-vacuum environment;
an optical element comprising a first body mounted within the vacuum chamber, the first body having at least one optical surface and at least one first heat transfer surface;
a plurality of actuators configured to support the first body via a plurality of first linkages, the actuators being operable to control the position and/or the orientation of the optical element with respect to a supporting structure;
a thermal conditioning element comprising a second body having at least one second heat transfer surface;
a gas deliverer configured to deliver a gas as a heat transfer medium into a heat transfer gap between the first and second heat transfer surfaces; and
a support configured to support the second body in a substantially fixed relation to the first body so as to maintain the heat transfer gap below a predetermined value without permitting contact between the first and second bodies, the support comprising a plurality of second linkages coupled to the plurality of actuators.

17. An optical system as claimed in claim 16, wherein the plurality of actuators comprises three actuators equally spaced around a circumference of the first body.

18. An optical system as claimed in claim 17, wherein each actuator is configured to drive the first body with two degrees of freedom, and wherein the three actuators together are configured to position and orient the optical element with six degrees of freedom.

19. A lithographic apparatus comprising:
a support configured to support a patterning device, the patterning device being configured to pattern a beam of radiation; and
a projection system configured to project the patterned beam of radiation onto a substrate, the projection system comprising an optical system, the optical system comprising
a vacuum chamber configured to contain the optical system within a near-vacuum environment,
an optical element comprising a first body mounted within the vacuum chamber, the first body having at least one optical surface and at least one first heat transfer surface,
a plurality of actuators configured to support the first body via a plurality of first linkages, the actuators being operable to control the position and/or the orientation of the optical element with respect to a supporting structure,
a thermal conditioning element comprising a second body having at least one second heat transfer surface,
a gas deliverer configured to deliver a gas as a heat transfer medium into a heat transfer gap between the first and second heat transfer surfaces, and
a second support configured to support the second body in a substantially fixed relation to the first body so as to maintain the heat transfer gap below a predetermined value without permitting contact between the first and second bodies, the second support comprising a plurality of second linkages coupled to the plurality of actuators.

20. A device manufacturing method, comprising:
patterning a beam of radiation with a patterning device;
projecting the patterned beam of radiation onto a substrate with a projection system; and
thermally conditioning an optical element operating in a vacuum environment in the projection system, wherein said optical element comprises a first body having at least one optical surface and at least one heat transfer surface, said thermally conditioning the optical element comprising
controlling a temperature of a second body to a desired temperature, the second body comprising a second heat transfer surface of a form complementary to that of the first heat transfer surface, dynamically controlling the first body in position and/or orientation with a first actuator, the first actuator being coupled to the first body via a first linkage, positioning the second body adjacent the first body and dynamically controlling the second body in position and/or orientation with a second actuator coupled to the second body via a second linkage so as to maintain the first and second heat transfer surfaces in a substantially constant arrangement without contact between the bodies, and delivering a gas as a heat transfer medium into a heat transfer space defined by the first and second heat transfer surfaces, while controlling the pressure of the gas in the heat transfer space to be at a predetermined value between about 30 Pa and about 300 Pa.

21. A method as claimed in claim 20, wherein for the dynamic control, the first body is coupled to a plurality of actuators via a plurality of first linkages and the second body is connected to the same actuators via a plurality of second linkages, the first linkages and the second linkages comprising spring elements configured to reduce transmission of vibrations from the second body to the first body.

* * * * *